Figure 1:
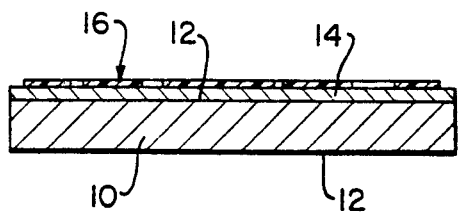

United States Patent [19]
Akyürek

[11] Patent Number: 5,275,770
[45] Date of Patent: Jan. 4, 1994

[54] METHOD FOR FABRICATION OF A CARRIER BODY OF ALUMINUM NITRIDE

[76] Inventor: Altan Akyürek, Eichenhainstr. 32/4/12, 8560 Lauf/Pegn., Fed. Rep. of Germany

[21] Appl. No.: 508,894

[22] Filed: Apr. 12, 1990

[51] Int. Cl.$^5$ .................. C04B 35/10; C04B 35/58
[52] U.S. Cl. ........................ 264/60; 264/61; 264/113; 264/332
[58] Field of Search .............. 264/60, 113, 332, 61

[56] References Cited

U.S. PATENT DOCUMENTS

| | | | |
|---|---|---|---|
| 2,949,704 | 8/1960 | Jacobs | 264/60 |
| 3,184,370 | 5/1965 | Luks | 264/60 |
| 4,129,243 | 12/1978 | Cusano et al. | 228/122 |
| 4,203,733 | 5/1980 | Tanaka | 264/60 |

Primary Examiner—James Derrington
Attorney, Agent, or Firm—Anderson Kill Olick & Oshinsky

[57] ABSTRACT

Aluminum nitride powder (28), possibly powdered glass (29) and aluminum oxide powder (23) are introduced into the molding cavity of a pressure matrix (26) for fabrication of a carrier body from aluminum nitride, whose surface is at least partially covered with aluminum oxide. Subsequently a pressure stamp (22) of the pressure tool (20) is introduced into the molded cavity of the pressure matrix (26). The powdered layers (28, 29, 30) are compressed and subsequently sintered, for instance for two hours at 1600° C. in a neutral atmosphere.

3 Claims, 1 Drawing Sheet

METHOD FOR FABRICATION OF A CARRIER BODY OF ALUMINUM NITRIDE

The invention is directed to a method for fabrication of a carrier body of aluminum nitride for electronic circuitry.

Carrier bodies or members for electronic circuitry consist of aluminum oxide, beryllium oxide or aluminum nitride.

Beryllium oxide has the best thermal conductivity. However beryllium oxide is very toxic. Vapors noxious to health arise already at soldering temperatures. Aluminum oxide is widely used. This material is absolutely non-toxic. The thermal conductivity of aluminum oxide however is considerably lower than that of beryllium oxide. Therefore electronic circuits attached to aluminum substrata have lower current-carrying capacities.

A particularity of aluminum oxide substrata is that metallic copper parts can be directly bonded thereon. This method is described for instance in the U.S. Pat. No. 4,129,243. This technology is termed "Direct Bond Copper" (DBC).

The thermal conductivity of aluminum nitride lies between that of aluminum oxide and beryllium oxide. In addition aluminum oxide is non-toxic. However, the adhesiveness of electronic circuit arrangements on aluminum nitride is completely unsatisfactory. For this reason the surface of the aluminum nitride-substrate must first of all be transformed into aluminum oxide.

A method for fabrication of aluminum nitride-substrata has become known from the publication "Toshiba Review" No. 153 Autumn 1985, pages 49 to 53. To begin with aluminum nitride and Yttrium oxide, both in powder form, are mixed. A viscous paste is formed with the use of organic binder agents, solvents, and plasticizers in suitable quantities, from which layers can be cast. The green ceramic layer is first of all heated to 700° C. in a nitrogen atmosphere, subsequently being sintered for two hours at 1800° C.

In order to obtain the aluminum oxide layer on the surface, the aluminum nitride substrate is treated at 1200°-1300° C. for twelve to twenty-four hours in an oxygen atmosphere. The oxide layer then has a thickness of between and 10 μm. This treatment requires much time and energy. The oxygen atmosphere does not only act upon the substrata rather also upon the furnace. Therefore either furnaces of very high quality have to be utilized or the furnaces have to be repaired after a comparatively short time.

The disadvantages described above explain that aluminum nitride has not yet been able to gain wide acceptance in actual practice.

The present invention is based upon the task of indicating a method for fabrication of a carrier body from aluminum nitride, whose surface is at least partially covered by a layer of aluminum oxide, which method is considerably simpler, faster and more economical than the known method.

In the process of the invention the carrier body with a desired sequence of layers is fabricated directly by an appropriate stacking of the raw materials in powder form. Pressing and sintering basically correspond to the fabrication methods used heretofore. The subsequent heat treatment lasting hours or days before obtaining the oxide surface is however entirely eliminated. The oxide layer can be made as thick as desired.

An additional task of the invention consists in improving the adhesiveness between aluminum nitride and aluminum oxide. The third task of the invention consists in improving the observation of the dimensions of the layers from aluminum nitride and aluminum oxide and to facilitate handling.

Figure 2:
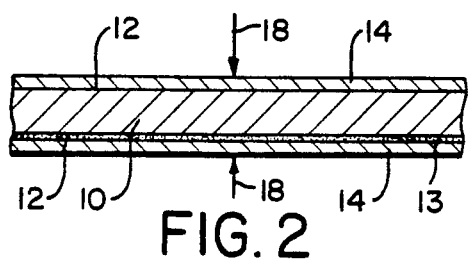
Figure 3:
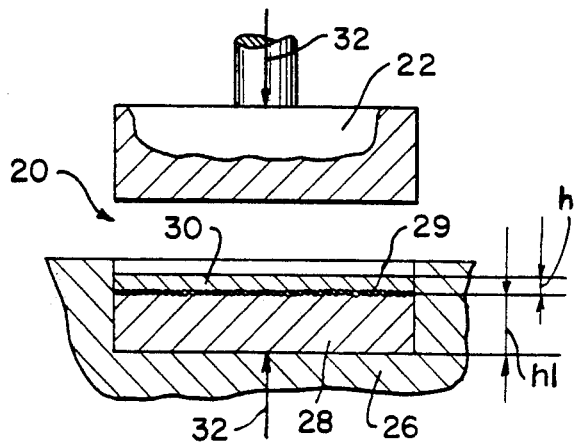
Figure 4:
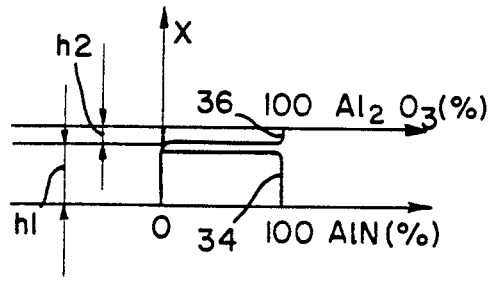
Figure 5:
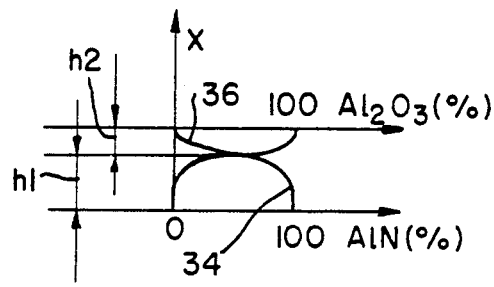

The invention, its advantages and variants are described with particularity with the help of the drawing. It is shown on:

FIG. 1 a section through a first carrier body from aluminum nitride with a copper sheet directly bonded thereon, FIG. 2 a section through an additional carrier body from aluminum nitride, FIG. 3 a section through a pressing tool for fabrication of a carrier body from aluminum nitride with a surface layer of aluminum oxide, FIG. 4 a section diagram reflecting the profile of the material composition of the carrier body in FIG. 3 and FIG. 5 a profile diagram of the material composition of another carrier body.

FIG. 1 shows a carrier body 10 from aluminum nitride which is covered at one of its two surfaces 12 by a layer of aluminum oxide. The material for the electronic circuitry 16, for instance a copper sheet, can be arranged so as to adhere solidly upon the aluminum oxide layer 14; this can be accomplished in a known manner.

FIG. 2 shows a carrier body 10 from aluminum nitride which is provided with one aluminum oxide layer 14 on each of its two opposite principal faces 12. The two aluminum oxide layers 14 are green, leather hard foils or sheets, in between which a green leather hard aluminum nitride member 10 is arranged. This build-up of layers from green members 10 and 14 is compressed which is indicated by the two arrows 18. Aluminum nitride 10 and aluminum oxide 14 can be joined by means of a bonding agent 13 in order to improve handling. At the same time or subsequently a sinter baking process is performed, in the course of which the aluminum nitride member 10 and the two aluminum oxide layers 14 are combined by sintering. After performing the sintering process an electronic circuit arrangement can be arranged in an adhesively tight fashion on each of the two aluminum oxide layers 14 in a manner known as such.

A pressing tool 20 is shown in segments in FIG. 3, which comprises a pressure stamp 22 and a pressure matrix 26 having a mold cavity. Aluminum nitride powder 28 to a height h1 possibly with addition of binders and sinter-assist agents, and on top of this aluminum oxide powder 30 to a height h2 is filled into this mold cavity. In order to improve the adhesiveness between aluminum oxide and aluminum nitride at the finished carrier body, a thin layer 29 of powdered glass can be introduced. Thereupon the pressure stamp 22 is pressed into the mold cavity of the pressure matrix 26 as it is indicated by the arrow 32. A self-supporting member is formed by this pressure application out of the powders 28, 29 and 30, which can subsequently be sintered. Herein a carrier body as shown in FIG. 1 is formed, which is covered on one side by an aluminum oxide layer 14.

A curve 34 and a curve 36 are shown in FIG. 4, wherein the curve 34 represents the content of aluminum nitride along the wall thickness x of the green molding fabricated in the pressure tool 20. Correspondingly curve 36 represents the content of aluminum oxide. The course of the aluminum nitride-aluminum oxide contents can be discerned from FIG. 4, which is stepped in a more or less sharp-edge manner. This means that a more or less sharp boundary transition exists between the aluminum oxide layer 14 and the aluminum nitride member 10.

Contrary to that, a progressive transition between the aluminum oxide (curve 36) and the aluminum nitride (curve 34) exists in FIG. 5. Such a progressive transition results in a sintering of the carrier body 10 without any problems arising.

It is also possible here to design the aluminum nitride body 10 with one each aluminum oxide layer 14 at both its surfaces 12. For this purpose a layer of aluminum oxide powder 30 must be first introduced into the molding cavity of the pressure matrix 26, thereupon a layer of aluminum nitride powder 25 and finally an additional layer of aluminum oxide powder 30, wherein as required one layer 29 of powdered glass is respectively provided. Thereupon the pressing and sintering processes are carried out.

I claim:

1. Method for fabrication of a carrier body (10) from aluminum nitride (AlN) for electronic circuitry (16), whose surface (12) is covered at least partially by a layer (14) of aluminum oxide ($Al_2O_3$), wherein AlN powder (28) and $Al_2O_3$-powder (30) are introduced into a pressure mold (20) to form superimposed layers and the powder layers (28, 30) are compressed together and finish-baked so as to form a self-supporting member.

2. Method according to claim 1, wherein glass as an adhesive assist agent, is introduced between the layer of AlN (28) and the layer of $Al_2O_3$ (30).

3. Method according to claim 1, wherein the AlN-powder layer (28) and $Al_2O_3$-powder layer (30) are joined with each other with the help of a bonding agent.

* * * * *